(12) United States Patent
Lim

(10) Patent No.: US 8,649,232 B2
(45) Date of Patent: Feb. 11, 2014

(54) INTERNAL VOLTAGE GENERATION CIRCUIT AND SEMICONDUCTOR INTEGRATED CIRCUIT

(75) Inventor: Hee Joon Lim, Cheongju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 189 days.

(21) Appl. No.: 13/243,775

(22) Filed: Sep. 23, 2011

(65) Prior Publication Data

US 2012/0170392 A1   Jul. 5, 2012

(30) Foreign Application Priority Data

Dec. 29, 2010   (KR) .................. 10-2010-0137922

(51) Int. Cl.
*G11C 7/00* (2006.01)

(52) U.S. Cl.
USPC ............ 365/194; 365/222; 365/226; 365/227

(58) Field of Classification Search
USPC .................. 365/194, 222, 226, 227, 228, 229
See application file for complete search history.

(56) References Cited

U.S. PATENT DOCUMENTS

| 2003/0035325 | A1* | 2/2003 | Kim et al. | 365/189.09 |
| 2004/0013024 | A1* | 1/2004 | Park | 365/226 |
| 2005/0041506 | A1* | 2/2005 | Hwang et al. | 365/222 |
| 2005/0232052 | A1* | 10/2005 | Jin | 365/226 |
| 2006/0158161 | A1* | 7/2006 | Kang | 323/234 |
| 2009/0097333 | A1* | 4/2009 | Gou | 365/189.09 |

FOREIGN PATENT DOCUMENTS

KR   10-0607161 B1   8/2006

* cited by examiner

*Primary Examiner* — Richard Elms
*Assistant Examiner* — Hien Nguyen
(74) *Attorney, Agent, or Firm* — William Park & Associates Patent Ltd.

(57) ABSTRACT

A semiconductor integrated circuit includes first and second bank groups, a first internal voltage control unit configured to generate a first enable pulse which is enabled when a first read operation or a first write operation is performed for banks included in the first bank group, and a first internal voltage generation unit configured to generate and supply a first internal voltage to the first bank group in response to the first enable pulse, wherein an enable period of the first enable pulse is set to be longer in the first write operation than in the first read operation.

18 Claims, 6 Drawing Sheets

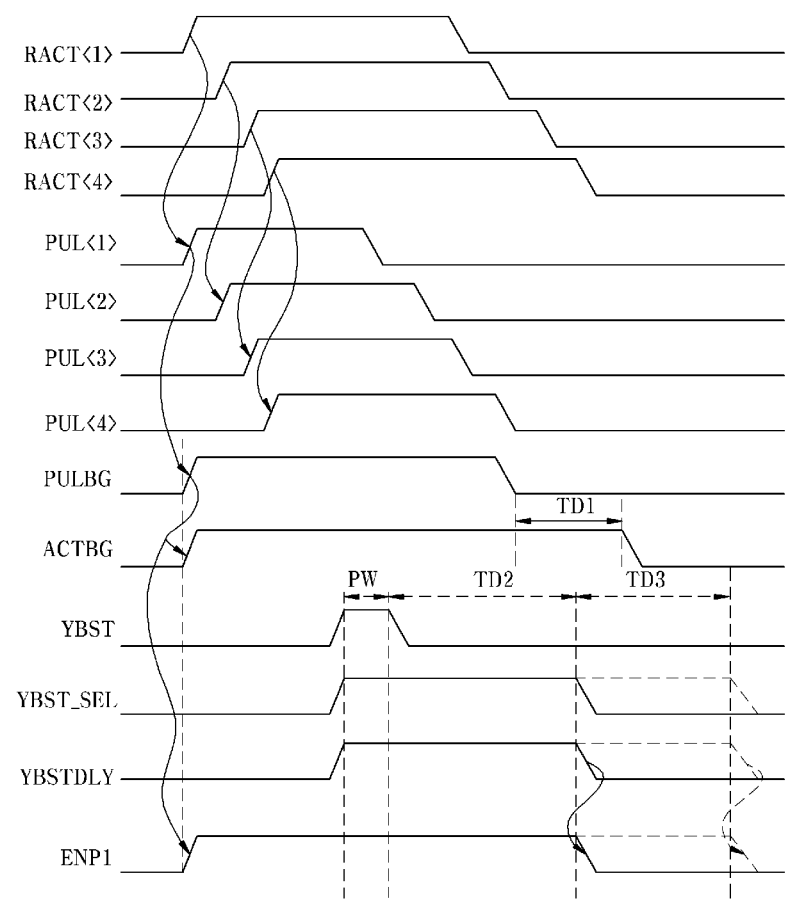

INTERNAL VOLTAGE GENERATION CIRCUIT AND SEMICONDUCTOR INTEGRATED CIRCUIT

CROSS-REFERENCES TO RELATED APPLICATIONS

The present application claims priority under 35 U.S.C 119(a) to Korean Application No. 10-2010-0137922, filed on Dec. 29, 2010, in the Korean Intellectual Property Office, which is incorporated herein by reference in its entirety set forth in full.

BACKGROUND

Exemplary embodiments of the present invention relate generally to an internal voltage generation circuit which may be applied to a semiconductor integrated circuit including a plurality of banks.

In general, a semiconductor integrated circuit is supplied with a power supply voltage (VDD) and a ground voltage (VSS) from an outside and generates therein internal voltages used to perform internal operations. The internal voltages used to perform the internal operations of the semiconductor integrated circuit may include a core voltage (VCORE) supplied to a memory core region, a high voltage (VPP) used when driving a word line or upon overdriving, a back-bias voltage (VBB) supplied as a bulk voltage of an NMOS transistor of a core region, and so forth.

Here, the core voltage (VCORE) may be supplied by reducing the power supply voltage (VDD) inputted from the outside. However, the high voltage (VPP) has a level higher than the power supply voltage (VDD) inputted from the outside, and the back-bias voltage (VBB) has a level lower than the ground voltage (VSS) inputted from the outside. Therefore, in order to supply the high voltage (VPP) and the back-bias voltage (VBB), a charge pump circuit generating power sources such as the high voltage (VPP) or the back-bias voltage (VBB) may be used.

Further, with the degree of high integration of a semiconductor integrated, more banks may be included in the semiconductor integrated circuit. Internal voltages are supplied, for example, only to banks which perform a read operation or a write operation. Accordingly, in order to supply internal voltages to corresponding banks, a plurality of internal voltage generation circuits may be provided in the semiconductor integrated circuit.

FIG. 1 is a timing diagram showing operations of a known internal voltage generation circuit.

Referring to FIG. 1, there are shown operations of an internal voltage generation circuit for supplying internal voltages to a first bank (not shown) and a second bank (not shown) included in a semiconductor integrated circuit. In FIG. 1, in the case where a read operation and a write operation are sequentially performed for the first bank and the second bank, the internal voltage generation circuit is activated by receiving an enable pulse ENP which is enabled to a logic high level in synchronization with a first bank active signal RACT<1>, and supplies internal voltages to the first and second banks. Thereafter, if the read operation and the write operation for the first and second banks are all completed and both the first bank active signal RACT<1> and a second bank active signal RACT<2> have a logic low level, the internal voltage generation circuit is deactivated by receiving the enable pulse ENP which is disabled to a logic low level and interrupts the supply of the internal voltages to the first and second banks. The first bank active signal RACT<1> is enabled to a logic high level when the read operation or the write operation is performed for the first bank, and the second bank active signal RACT<2> is enabled to a logic high level when the read operation or the write operation is performed for the second bank.

As the number of banks increases with the degree of high integration of a semiconductor integrated circuit, the number of control signals for controlling the activation of the internal voltage generation circuits increases. For example, the number of the internal voltage generation circuits in a semiconductor integrated circuit, such as DDR4 SDRAM including 16 banks therein, may be twice as many as that of a semiconductor integrated circuit including 8 banks therein. Also, the number of control signals for controlling the internal voltage generation circuits in the semiconductor integrated circuit such as the DDR4 SDRAM including 16 banks therein may be twice as many as that of a semiconductor integrated circuit including 8 banks therein.

Because a write operation needs to drive a write driver and a local input/output line, the write operation may consume more internal voltages than a read operation. However, in the known internal voltage generation circuit, the internal voltage generation circuit is activated during the same period and supplies the internal voltages in the write and read operations. Accordingly, the internal voltages may not be sufficiently supplied during the write operation and the internal voltages may be excessively supplied during the read operation.

SUMMARY

An embodiment of the present invention relates to an internal voltage generation circuit which can controllably drive internal voltages by grouping a plurality of banks so as to decrease the number of control signals and can control the supply periods of the internal voltages depending upon consumption of the internal voltages.

In an embodiment, a semiconductor integrated circuit includes: first and second bank groups; and a first internal voltage generation circuit having a first internal voltage control unit configured to generate a first enable pulse which is enabled when a first read operation or a first write operation is performed for banks included in the first bank group and a first internal voltage generation unit configured to generate and supply a first internal voltage to the first bank group in response to the first enable pulse, wherein an enable period of the first enable pulse is set to be longer in the first write operation than in the first read operation.

In an embodiment, an internal voltage generation circuit includes: an internal voltage control unit configured to generate an enable pulse which is enabled when a read operation or a write operation is performed for first to fourth banks; and an internal voltage generation unit configured to generate and supply an internal voltage to the first to fourth banks in response to the enable pulse, wherein an enable period of the enable pulse is set to be longer in the write operation than in the read operation.

BRIEF DESCRIPTION OF THE DRAWINGS

The above and other aspects, features and other advantages will be more clearly understood from the following detailed description taken in conjunction with the accompanying drawings, in which:

FIG. 9 is a timing diagram explaining operations of the first internal voltage control unit shown in FIG. 3.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 2:
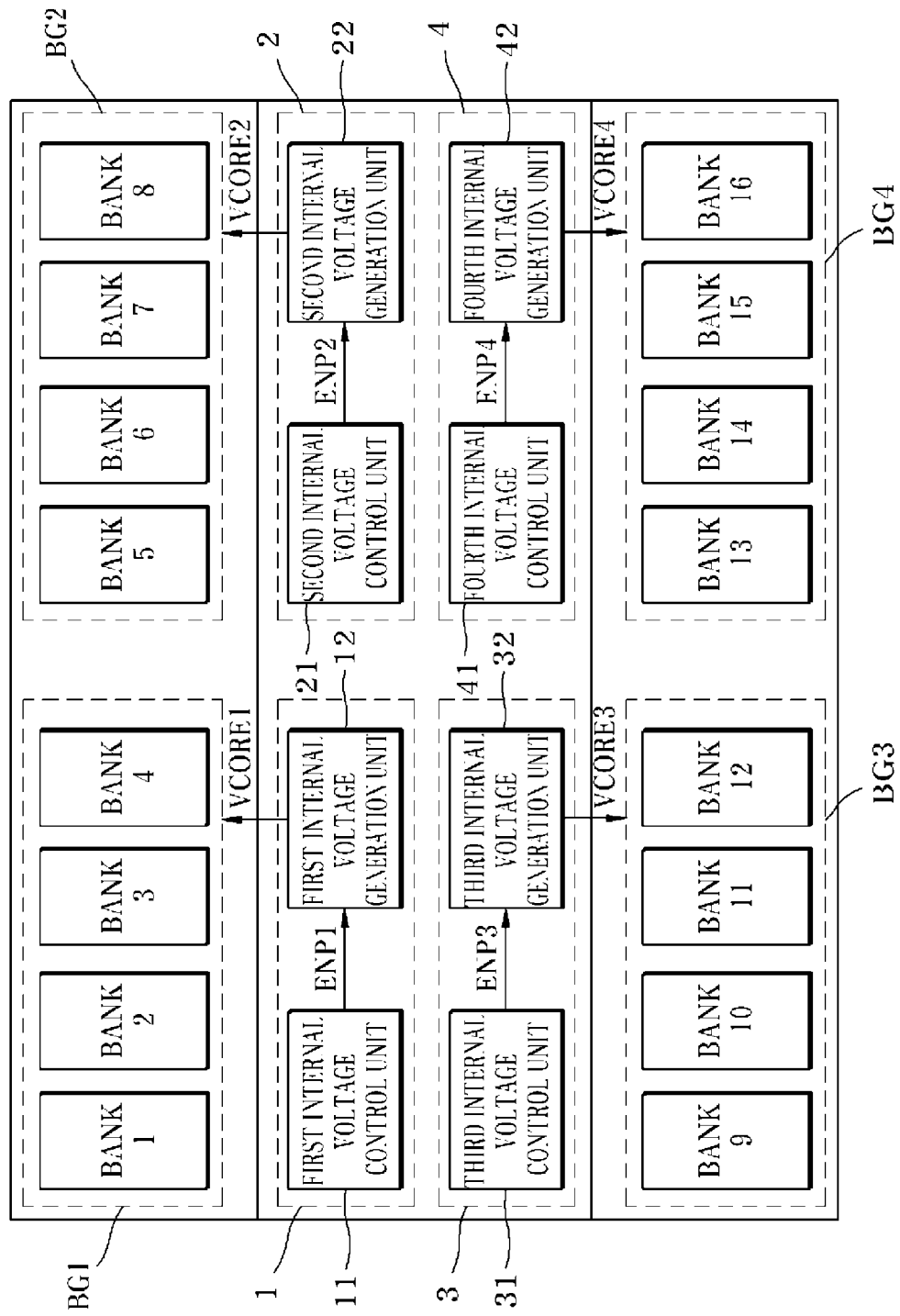
FIG. 2 is a block diagram showing an exemplary configuration of a semiconductor integrated circuit in accordance with an embodiment of the present invention.

FIG. 2 is a block diagram showing an exemplary configuration of a semiconductor integrated circuit in accordance with an embodiment of the present invention.

Referring to FIG. 2, a semiconductor integrated circuit in accordance with an embodiment of the present invention includes a first internal voltage generation circuit 1 configured to supply a first internal voltage VCORE1 to a first bank group BG1 constituted by first, second, third and fourth banks BANK1, BANK2, BANK3 and BANK4, a second internal voltage generation circuit 2 configured to supply a second internal voltage VCORE2 to a second bank group BG2 constituted by fifth, sixth, seventh and eighth banks BANK5, BANK6, BANK7 and BANK5, a third internal voltage generation circuit 3 configured to supply a third internal voltage VCORE3 to a third bank group BG3 constituted by ninth, tenth, eleventh and twelfth banks BANK5, BANK10, BANK11 and BANK12, and a fourth internal voltage generation circuit 4 configured to supply a fourth internal voltage VCORE4 to a fourth bank group BG4 constituted by thirteenth, fourteenth, fifteenth and sixteenth banks BANK13, BANK14, BANK15 and BANK16.

Figure 1:
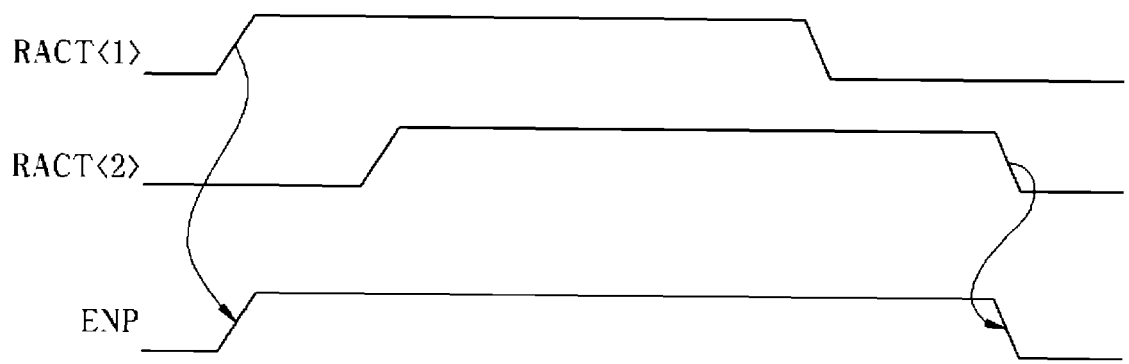
FIG. 1 is a timing diagram showing operations of a known internal voltage generation circuit.

The first internal voltage generation circuit 1 includes a first internal voltage control unit 11 configured to generate a first enable pulse ENP1 which is enabled when performing a read operation or a write operation for the first bank group BG1, and a first internal voltage generation unit 12 configured to generate and supply the first internal voltage VCORE1 to the first bank group BG1 during the enable period of the first enable pulse ENP1. The second internal voltage generation circuit 2 includes a second internal voltage control unit 21 configured to generate a second enable pulse ENP2 which is enabled when performing a read operation or a write operation for the second bank group BG2, and a second internal voltage generation unit 22 configured to generate and supply the second internal voltage VCORE2 to the second bank group BG2 during the enable period of the second enable pulse ENP2. The third internal voltage generation circuit 3 includes a third internal voltage control unit 31 configured to generate a third enable pulse ENP3 which is enabled when performing a read operation or a write operation for the third bank group BG3, and a third internal voltage generation unit 32 configured to generate and supply the third internal voltage VCORE3 to the third bank group BG3 during the enable period of the third enable pulse ENP3. The fourth internal voltage generation circuit 4 includes a fourth internal voltage control unit 41 configured to generate a fourth enable pulse ENP4 which is enabled when performing a read operation or a write operation for the fourth bank group BG4, and a fourth internal voltage generation unit 42 configured to generate and supply the fourth internal voltage VCORE4 to the fourth bank group BG4 during the enable period of the fourth enable pulse ENP4. The first, second, third and fourth internal voltage generation circuits 1, 2, 3 and 4 may be configured in substantially the same way with one another except that the first, second, third and fourth internal voltages VCORE1, VCORE2, VCORE3 and VCORE4 are respectively supplied to the first, second, third and fourth bank groups BG1, BG2, BG3 and BG4. Therefore, an exemplary configurations and operations of the first internal voltage control unit 11 and the first internal voltage generation unit 12 included in the first internal voltage generation circuit 1 shown in FIG. 1 will be mainly described below.

Figure 3:
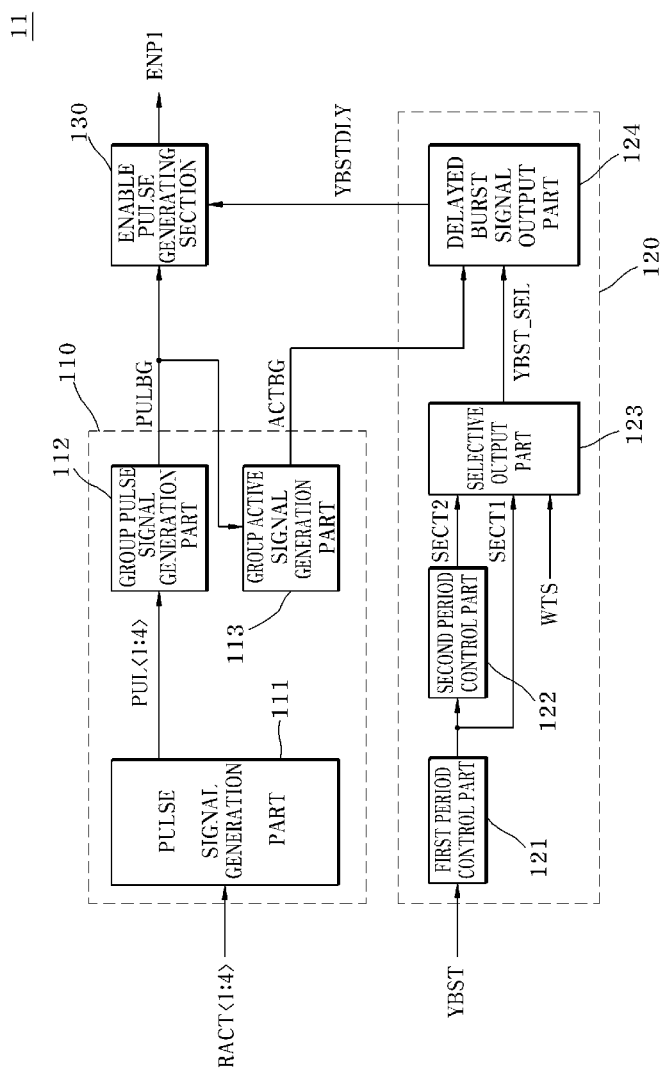
FIG. 3 is a block diagram showing an exemplary configuration of a first internal voltage control unit included in the semiconductor integrated circuit shown in FIG. 2.

Referring to FIG. 3, the first internal voltage control unit 11 includes a group signal generating section 110, a delayed burst signal generating section 120, and an enable pulse generating section 130. The group signal generating section 110 includes a pulse signal generation part 111, a group pulse signal generation part 112 and a group active signal generation part 113. The delayed burst signal generating section 120 includes a first period control part 121, a second period control part 122, a selective output part 123, and a delayed burst signal output part 124.

The pulse signal generation part 111 is configured to generate a first pulse signal PUL<1>, according to an example, in synchronization with the enable timing of a first bank active signal RACT<1>, generate a second pulse signal PUL<2>, according to an example, in synchronization with the enable timing of a second bank active signal RACT<2>, generate a third pulse signal PUL<3>, according to an example, in synchronization with the enable timing of a third bank active signal RACT<3>, and generate a fourth pulse signal PUL<4>, according to an example, in synchronization with the enable timing of a fourth bank active signal RACT<4>. The first bank active signal RACT<1> is enabled to a logic high level to perform a read operation or a write operation for the first bank BANK1, the second bank active signal RACT<2> is enabled to a logic high level to perform a read operation or a write operation for the second bank BANK2, the third bank active signal RACT<3> is enabled to a logic high level to perform a read operation or a write operation for the third bank BANK3, and the fourth bank active signal RACT<4> is enabled to a logic high level to perform a read operation or a write operation for the fourth bank BANK4.

The group pulse signal generation part 112 is configured to receive the first, second, third and fourth pulse signals PUL<1:4> and generate a group pulse signal PULBG. The group pulse signal PULBG is enabled to a logic high level when at least one of the first, second, third and fourth pulse signals PUL<1:4> is enabled to a logic high level, and is disabled to a logic low level when all the first, second, third and fourth pulse signals PUL<1:4> are disabled to a logic low level.

Figure 4:
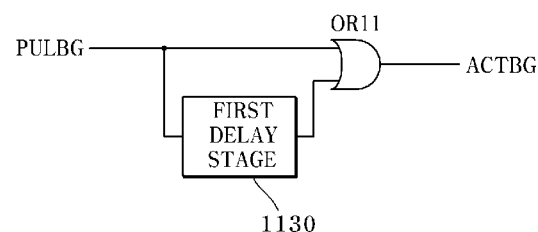
FIG. 4 is a circuit diagram showing an exemplary embodiment of a group active signal generating section included in the first internal voltage control unit shown in FIG. 3.

Referring to FIG. 4, the group active signal generation part 113 includes a first delay stage 1130 configured to delay the group pulse signal PULBG by a first delay period, and an OR gate OR11 configured to receive the group pulse signal PULBG and the output signal of the first delay stage 1130, perform an ORing operation and generate a group active signal ACTBG. The group active signal ACTBG is generated to have an enable period that is longer by the first delay period than the group pulse signal PULBG. The enable period of the group active signal ACTBG is set to include the enable periods of the first, second, third and fourth bank active signals RACT<1:4>.

Through the configuration mentioned above, the group signal generating section 110 of FIG. 3 may generate the group pulse signal PULBG which has an enable period set by the first, second, third and fourth pulse signals PUL<1:4>, and the group active signal ACTBG which is enabled to a logic high level during a period in which the first, second, third and fourth bank active signals RACT<1:4> are enabled.

Figure 5:
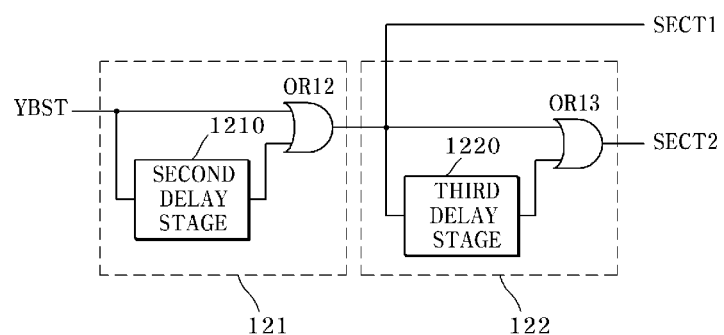
FIG. 5 is a circuit diagram showing an exemplary embodiment of first and second period control parts included in the first internal voltage control unit shown in FIG. 3.

Referring to FIG. 5, the first period control part 121 includes a second delay stage 1210 configured to delay a burst signal YBST by a second delay period, and an OR gate OR12 configured to receive the burst signal YBST and the output signal of the second delay stage 1210, perform an ORing operation and generate a first period signal SECT1. The first period signal SECT1 is generated to have an enable period that is longer by the second delay period than the burst signal YBST. The burst signal YBST is a pulse signal which is generated with a minimum interval tCCD between commands for a column operation when a read operation or a write operation is performed for the first, second, third and fourth banks BANK1, BANK2, BANK3 and BANK4 included in the first bank group GB1.

Referring to FIG. 5, the second period control part 122 includes a third delay stage 1220 configured to delay the first period signal SECT1 by a third delay period, and an OR gate OR13 configured to receive the first period signal SECT1 and the output signal of the third delay stage 1220, perform an ORing operation and generate a second period signal SECT2. The second period signal SECT2 is generated to have an enable period that is longer by the third delay period than the first period signal SECT1.

Figure 6:
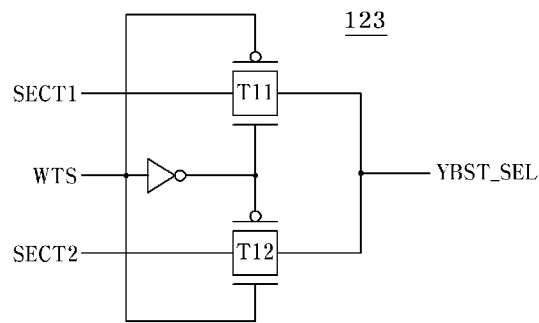
FIG. 6 is a circuit diagram showing an exemplary embodiment of a selective output part included in the first internal voltage control unit shown in FIG. 3.

Referring to FIG. 6, the selective output part 123 includes a first transmission gate T11 configured to be turned on in response to a write signal WTS which is enabled to a logic high level when a write operation is performed for the first, second, third and fourth banks BANK1, BANK2, BANK3 and BANK4 included in the first bank group BG1 and transmit the first period signal SECT1 as a burst selection signal YBST_SEL, and a second transmission gate T12 configured to be turned on in response to the write signal WTS and transmit the second period signal SECT2 as the burst selection signal YBST_SEL. In the case where a write operation is performed for the first bank group BG1, the second period signal SECT2 is transmitted as the burst selection signal YBST_SEL, and in the case where a read operation is performed for the first bank group BG1, the first period signal SECT1 is transmitted as the burst selection signal YBST_SEL.

Figure 7:
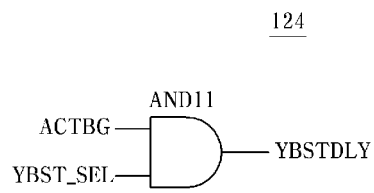
FIG. 7 is a circuit diagram showing an exemplary embodiment of a delayed burst signal output part included in the first internal voltage control unit shown in FIG. 3.

Referring to FIG. 7, the delayed burst signal output part 124 includes an AND gate AND11 configured to receive the group active signal ACTBG and the burst selection signal YBST_SEL, perform an ANDing operation and output a delayed burst signal YBSTDLY. The delayed burst signal output part 124 transmits the burst selection signal YBST_SEL as the delayed burst signal YBSTDLY during a period in which the group active signal ACTBG has a logic high level.

Through the configuration mentioned above, the delayed burst signal generating section 120 of FIG. 3 may output the second period signal SECT2 as the delayed burst signal YBSTDLY when a write operation is performed for the first bank group BG1, and outputs the first period signal SECT1 as the delayed burst signal YBSTDLY when a read operation is performed for the first bank group BG1.

Figure 8:
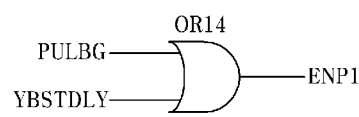
FIG. 8 is a circuit diagram showing an exemplary embodiment of an enable pulse generating section included in the first internal voltage control unit shown in FIG. 3.

Referring to FIG. 8, the enable pulse generating section 130 includes an OR gate OR14 configured to receive the group pulse signal PULBG and the delayed burst signal YBSTDLY, perform an ORing operation and generate the first enable pulse ENP1. The first enable pulse ENP1 is enabled to a logic high level when at least one of the group pulse signal PULBG and the delayed burst signal YBSTDLY is enabled to a logic high level.

Hereafter, operations of the first internal voltage control unit 11 having the configuration as mentioned above will be described with reference to FIG. 9 assuming that a read operation and a write operation are sequentially performed for the first, second, third and fourth banks BANK1, BANK2, BANK3 and BANK4 included in the first bank group BG1.

When a read operation and a write operation are to be sequentially performed for the first, second, third and fourth banks BANK1, BANK2, BANK3 and BANK4, the first, second, third and fourth bank active signals RACT<1:4> are sequentially enabled to a logic high level.

The pulse signal generation part 111 generates the first pulse signal PUL<1> in synchronization with the enable timing of the first bank active signal RACT<1>, generates the second pulse signal PUL<2> in synchronization with the enable timing of the second bank active signal RACT<2>, generates the third pulse signal PUL<3> in synchronization with the enable timing of the third bank active signal RACT<3>, and generates the fourth pulse signal PUL<4> in synchronization with the enable timing of the fourth bank active signal RACT<4>.

The group pulse signal generation part 112 generates the group pulse signal PULBG which is enabled to a logic high level when at least one of the first, second, third and fourth pulse signals PUL<1:4> is enabled to a logic high level and is disabled to a logic low level when all the first, second, third and fourth pulse signals PUL<1:4> are disabled to a logic low level.

The group active signal generation part 113 generates the group active signal ACTBG which has an enable period set to be longer by a first delay period TD1 of the first delay stage 1130 than the enable period of the group pulse signal PULBG.

The delayed burst signal output part 124 receives the burst selection signal YBST_SEL and the group active signal ACTBG and generates the delayed burst signal YBSTDLY. The enable period of the delayed burst signal YBSTDLY is set to be longer when a write operation is performed for the first, second, third and fourth banks BANK1, BANK2, BANK3 and BANK4 included in the first bank group BG1 than when a read operation is performed for the first, second, third and fourth banks BANK1, BANK2, BANK3 and BANK4 included in the first bank group BG1. Hereinbelow, operations for generating the delayed burst signal YBSTDLY will be described by being divided into a case where a write operation is performed for the first, second, third and fourth banks BANK1, BANK2, BANK3 and BANK4 included in the first bank group BG1 and a case where a read operation is performed for the first, second, third and fourth banks BANK1, BANK2, BANK3 and BANK4 included in the first bank group BG1.

In the case where a read operation is performed for the first bank group BG1, the enable period of the delayed burst signal YBSTDLY is set to be longer by a second delay period TD2 of the second delay stage 1210 than a pulse width PW of the burst signal YBST. This is because the first period signal SECT1 is transmitted as the burst selection signal YBST_SEL in response to the write signal WTS disabled during the read operation, and the burst selection signal YBST_SEL is transmitted as the delayed burst signal YBSTDLY during a period in which the group active signal ACTBG has a logic high level.

In the case where a write operation is performed for the first bank group BG1, the enable period of the delayed burst signal YBSTDLY is set to be longer, by the sum of the second delay period TD2 of the second delay stage 1210 and a third delay period TD3 of the third delay stage 1220, than the pulse width PW of the burst signal YBST. This is because the second period signal SECT2 is transmitted as the burst selection signal YBST_SEL in response to the write signal WTS enabled during the write operation, and the burst selection signal YBST_SEL is transmitted as the delayed burst signal YBSTDLY during a period in which the group active signal ACTBG has a logic high level.

The enable pulse generating section 130 generates the first enable pulse ENP1 enabled to a logic high level when at least one of the group pulse signal PULBG and the delayed burst signal YBSTDLY is enabled to a logic high level. Accordingly, the enable period of the first enable pulse ENP1 is defined from a time at which the group pulse signal PULBG is enabled to a logic high level to a time at which the delayed burst signal YBSTDLY is disabled to a logic low level.

The first internal voltage control unit 11 described above generates the first enable pulse ENP1 which is enabled when a read operation or a write operation is performed for the first bank group BG1. The enable period of the first enable pulse ENP1 is set to be longer when a write operation is performed for the first bank group BG1 than when a read operation is performed for the first bank group BG1. Therefore, the first internal voltage generation unit 12 supplies the first internal voltage VCORE1 to the first bank group BG1, for a longer period when a write operation is performed for the first bank group BG1 than when a read operation is performed for the first bank group BG1.

As is apparent from the above descriptions, in the internal voltage generation circuit according to the embodiment of the present invention, since four banks included in a semiconductor integrated circuit are grouped into one group, the number of control signals necessary for supply of internal voltages may be minimized. Also, in the internal voltage generation circuit according to the embodiment of the present invention, because a period for supplying internal voltage is set to be longer in a write operation than in a read operation, internal voltages may be sufficiently supplied in the write operation in which current consumption increases, and it is possible to prevent internal voltages from being excessively supplied in the read operation in which current consumption decreases.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor integrated circuit comprising:
    first and second bank groups;
    a first internal voltage control unit configured to generate a first enable pulse which is enabled when a first read operation or a first write operation is performed for banks included in the first bank group; and
    a first internal voltage generation unit configured to generate and supply a first internal voltage to the first bank group in response to the first enable pulse,
    wherein the first enable pulse is enabled in response to bank active signals and disabled in response to a delayed burst signal with an enable period that is longer in the first write operation than in the first read operation.

2. The semiconductor integrated circuit of claim 1, wherein the first internal voltage control unit comprises:
    a group signal generating section configured to generate a group pulse signal and a group active signal which are enabled in synchronization with the bank active signals;
    a delayed burst signal generating section configured to receive a burst signal, generate a burst selection signal with an enable period that is longer in the first write operation than in the first read operation, and generate the delayed burst signal with an enable period that is set by the group active signal and the burst selection signal; and
    an enable pulse generating section configured to generate the first enable pulse which is enabled in response to the group pulse signal and is disabled in response to the delayed burst signal.

3. The semiconductor integrated circuit of claim 2, wherein the group signal generating section comprises:
    a pulse signal generation part configured to generate first, second, third and fourth pulse signals in synchronization with first, second, third and fourth bank active signals;
    a group pulse signal generation part configured to receive the first, second, third and fourth pulse signals and generate the group pulse signal; and
    a group active signal generation part configured to generate the group active signal which has an enable period longer than the group pulse signal.

4. The semiconductor integrated circuit of claim 2, wherein the delayed burst signal generating section comprises:
    a first period control part configured to control a pulse width of the burst signal and generate a first period signal;
    a second period control part configured to control an enable period of the first period signal and generate a second period signal;
    a selective output part configured to selectively output the first period signal or the second period signal as the burst selection signal in response to a write signal; and
    a delayed burst signal output part configured to transmit the burst selection signal as the delayed burst signal in response to the group active signal.

5. The semiconductor integrated circuit of claim 4, wherein the enable period of the first period signal is set to be longer than an enable period of the burst signal, and an enable period of the second period signal is set to be longer than the enable period of the first period signal.

6. The semiconductor integrated circuit of claim 5, wherein the selective output part outputs the second period signal as the burst selection signal when the first write operation is performed.

7. The semiconductor integrated circuit of claim 1, further comprising:
    a second internal voltage control unit configured to generate a second enable pulse which is enabled when a second read operation or a second write operation is performed for banks included in the second bank group; and a second internal voltage generation unit configured to generate and supply a second internal voltage to the second bank group in response to the second enable pulse, wherein an enable period of the second enable pulse is set to be longer in the second write operation than in the second read operation.

8. The semiconductor integrated circuit of claim 7, wherein the second internal voltage control unit comprises:
a group signal generating section configured to generate a group pulse signal and a group active signal which are enabled in synchronization with bank active signals;
a delayed burst signal generating section configured to receive a burst signal, generate a burst selection signal with an enable period that is longer in the second write operation than in the second read operation, and generate a delayed burst signal with an enable period that is set by the group active signal and the burst selection signal; and
an enable pulse generating section configured to generate the second enable pulse which is enabled in response to the group pulse signal and is disabled in response to the delayed burst signal.

9. The semiconductor integrated circuit of claim 8, wherein the group signal generating section comprises:
a pulse signal generation part configured to generate first, second, third and fourth pulse signals in synchronization with first, second, third and fourth bank active signals;
a group pulse signal generation part configured to receive the first, second, third and fourth pulse signals and generate the group pulse signal; and
a group active signal generation part configured to generate the group active signal which has an enable period longer than the group pulse signal.

10. The semiconductor integrated circuit of claim 8, wherein the delayed burst signal generating section comprises:
a first pulse width control part configured to control a pulse width of the burst signal and generate a first period signal;
a second pulse width control part configured to control an enable period of the first period signal and generate a second period signal;
a selective output part configured to selectively output the first period signal or the second period signal as the burst selection signal in response to a write signal; and
a delayed burst signal output part configured to transmit the burst selection signal as the delayed burst signal in response to the group active signal.

11. The semiconductor integrated circuit of claim 10, wherein the enable period of the first period signal is set to be longer than an enable period of the burst signal, and an enable period of the second period signal is set to be longer than the enable period of the first period signal.

12. The semiconductor integrated circuit of claim 11, wherein the selective output part outputs the second period signal as the burst selection signal when the second write operation is performed.

13. An internal voltage generation circuit comprising:
an internal voltage control unit configured to generate an enable pulse which is enabled when a read operation or a write operation is performed for first, second, third and fourth banks; and
an internal voltage generation unit configured to generate and supply an internal voltage to the first, second, third and fourth banks in response to the enable pulse,
wherein the enable pulse is enabled in response to bank active signals and disabled in response to a delayed burst signal with an enable period that is longer in the write operation than in the read operation.

14. The internal voltage generation circuit of claim 13, wherein the internal voltage control unit comprises:
a group signal generating section configured to generate a group pulse signal and a group active signal which are enabled in synchronization with first, second, third and fourth bank active signals;
a delayed burst signal generating section configured to receive a burst signal, generate a burst selection signal with an enable period that is longer in the write operation than in the read operation, and generate the delayed burst signal with an enable period that is set by the group active signal and the burst selection signal; and
an enable pulse generating section configured to generate the enable pulse which is enabled in response to the group pulse signal and is disabled in response to the delayed burst signal.

15. The internal voltage generation circuit of claim 14, wherein the group signal generating section comprises:
a pulse signal generation part configured to generate first, second, third and fourth pulse signals in synchronization with the first, second, third and fourth bank active signals;
a group pulse signal generation part configured to receive the first, second, third and fourth pulse signals and generate the group pulse signal which is enabled during enable periods of the first, second, third and fourth bank active signals; and
a group active signal generation part configured to generate the group active signal which has an enable period longer than the group pulse signal.

16. The internal voltage generation circuit of claim 14, wherein the delayed burst signal generating section comprises:
a first period control part configured to control a pulse width of the burst signal and generate a first period signal;
a second period control part configured to control an enable period of the first period signal and generate a second period signal;
a selective output part configured to selectively output the first period signal or the second period signal as the burst selection signal in response to a write signal; and
a delayed burst signal output part configured to transmit the burst selection signal as the delayed burst signal in response to the group active signal.

17. The internal voltage generation circuit of claim 16, wherein the enable period of the first period signal is set to be longer than an enable period of the burst signal, and an enable period of the second period signal is set to be longer than the enable period of the first period signal.

18. The internal voltage generation circuit of claim 17, wherein the selective output part outputs the second period signal as the burst selection signal when the write operation is performed.

* * * * *